(12) United States Patent
Su et al.

(10) Patent No.: US 9,874,318 B2
(45) Date of Patent: Jan. 23, 2018

(54) LED ASSEMBLY AND LED BULB USING THE SAME

(71) Applicants: EPISTAR CORPORATION, Science-based Industrial Park (TW); INTERLIGHT OPTOTECH CORPORATION, Yangmei (TW)

(72) Inventors: Hwa Su, Yangmei (TW); Tzu Chi Cheng, Yangmei (TW); Hong Zhi Liu, Yangmei (TW); Yu Min Li, Yangmei (TW)

(73) Assignees: EPISTAR CORPORATION, Hsinchu (TW); INTERLIGHT OPTOTECH CORPORATION, Yangmei (TW)

( * ) Notice: Subject to any disclaimer, the term of this patent is extended or adjusted under 35 U.S.C. 154(b) by 0 days.

(21) Appl. No.: 14/676,436

(22) Filed: Apr. 1, 2015

(65) Prior Publication Data
US 2015/0276152 A1    Oct. 1, 2015

(30) Foreign Application Priority Data

Apr. 1, 2014 (TW) .............................. 103112161 A

(51) Int. Cl.
*F21K 99/00* (2016.01)
*H01L 25/075* (2006.01)
(Continued)

(52) U.S. Cl.
CPC ................ *F21K 9/56* (2013.01); *F21K 9/232* (2016.08); *F21K 9/64* (2016.08); *H01L 25/0753* (2013.01);
(Continued)

(58) Field of Classification Search
CPC ... F21K 9/56; F21K 9/64; F21K 9/232; F21K 9/90; H01L 25/0753; H01L 33/505;
(Continued)

(56) References Cited

U.S. PATENT DOCUMENTS

2012/0193651 A1 * 8/2012 Edmond ............ H01L 25/0753
257/88
2013/0064260 A1 3/2013 Tanda et al.
(Continued)

FOREIGN PATENT DOCUMENTS

WO    2013153726 A1    10/2013

OTHER PUBLICATIONS

Translation of WO2013153726A1; google.com/patents; Dec. 26, 2016.*

*Primary Examiner* — Laura Tso
(74) *Attorney, Agent, or Firm* — Patterson + Sheridan, LLP

(57) ABSTRACT

An LED assembly, comprising: a light-transmissive substrate comprising a surface, a central region and a peripheral region surrounding the central region; a heat dissipation element, wherein a portion of the heat dissipation element is corresponding to the central region of the light-transmissive substrate; a first wavelength conversion layer arranged on the surface of the light-transmissive substrate and corresponding to the peripheral region of the light-transmissive substrate; a plurality of LED elements arranged on the first wavelength conversion layer; a second wavelength conversion layer arranged on the surface of the light-transmissive substrate and covering the plurality of LED elements and the first wavelength conversion layer; a plurality of conductive structures surrounding the plurality of LED elements and electrically connected thereto, wherein the plurality of conductive structures is formed on the surface and separated from each other; and a plurality of electrical contacts electrically connected to the plurality of conductive structures respectively.

21 Claims, 14 Drawing Sheets

(51) Int. Cl.
 *F21K 9/232* (2016.01)
 *F21K 9/64* (2016.01)
 *F21K 9/90* (2016.01)
 *H01L 33/50* (2010.01)
 *H01L 33/62* (2010.01)
 *F21Y 101/00* (2016.01)

(52) U.S. Cl.
 CPC ............ *F21K 9/90* (2013.01); *F21Y 2101/00* (2013.01); *H01L 33/505* (2013.01); *H01L 33/62* (2013.01); *H01L 2224/48137* (2013.01); *H01L 2924/0002* (2013.01)

(58) Field of Classification Search
 CPC ............ H01L 3/62; H01L 2224/48137; H01L 2924/0002; F21Y 2101/00
 USPC .......................................................... 362/84
 See application file for complete search history.

(56) References Cited

U.S. PATENT DOCUMENTS

| | | | |
|---|---|---|---|
| 2013/0114253 A1 | 5/2013 | Segawa et al. | |
| 2014/0071672 A1* | 3/2014 | Dau | H05B 33/0845 362/235 |
| 2014/0085884 A1* | 3/2014 | Horio | H01L 25/0753 362/235 |

\* cited by examiner

US 9,874,318 B2

LED ASSEMBLY AND LED BULB USING THE SAME

CROSS-REFERENCE TO RELATED APPLICATION

This application claims priority to and the benefit of TW Application Number 103112161 filed on Apr. 1, 2014, which is incorporated by reference in its entirety.

TECHNICAL FIELD

The present disclosure relates generally to light source and illumination device, more particularly to LED assembly and LED bulb using the same.

DESCRIPTION OF BACKGROUND ART

Since Edison had used tungsten wire as the light emitting element of the bulb, the history of the traditional light bulb has been lasting for more than a hundred years. Because the incandescent light bulb is an omni-directional lighting and is safer than the candle or the kerosene lamp which might be easy to cause the disaster. Therefore, the incandescent light bulb is rapidly replacing the illumination device like the candle or the kerosene. However, the incandescent light bulb has low power efficiency so people are eager to find a more energy-efficient technology to replace the traditional incandescent light bulb.

The light-emitting diode (hereinafter referred to as LED) currently used in the light source of the illumination device is a higher efficient electronic component and in line with the trend of green energy. However, the light emitted from LED generally has directivity. Thus, although LED has the advantages of much low power consumption, LED lighting products and related design need further improvements to change the light pattern to meet the demand of omnidirectional lighting.

In addition, the LED can be further connected to other components in order to form a light-emitting apparatus including a sub-mount carrying an electrical circuit and a solder formed above the sub-mount.

SUMMARY OF THE DISCLOSURE

The embodiment of the present application discloses an LED assembly and an LED bulb using the LED assembly. The LED assembly includes a light-transmissive substrate, a heat dissipation element, a plurality of LED elements, a first wavelength conversion layer, a second wavelength conversion layer, a plurality of conductive structures, and a plurality of electrical contacts. The light-transmissive substrate comprises a substrate surface, a central region and a peripheral region surrounding the central region. A portion of the heat dissipation element is corresponding to the central region of the light-transmissive substrate. The first wavelength conversion layer is disposed on the surface of the light-transmissive substrate and corresponding to the peripheral region of the light-transmissive substrate. The LED elements are disposed on the first wavelength conversion layer. The second wavelength conversion layer is disposed on the surface of the light-transmissive substrate and covers the LED elements and the first wavelength conversion layer. The conductive structures surround and are electrically connected to the LED elements, wherein the conductive structures are formed on the surface and separated from each other. The electrical contacts are electrically connected to the plurality of conductive structures respectively.

BRIEF DESCRIPTION OF THE DRAWINGS

Non-limiting and non-exhaustive embodiments of the present application are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The application can be more fully understood by the subsequent detailed description and examples with references made to the accompanying drawings, wherein.

DETAILED DESCRIPTION OF PREFERRED EMBODIMENTS

First Embodiment

Figure 1A:
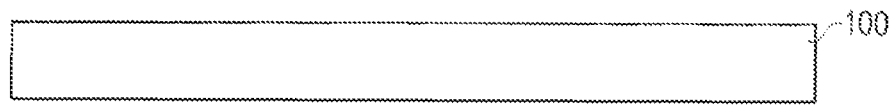
FIGS. 1A, 1B, 1C, and 1D demonstrate the flowcharts of a method of manufacturing an LED assembly according to the first embodiment of the present application.
Figure 1B:
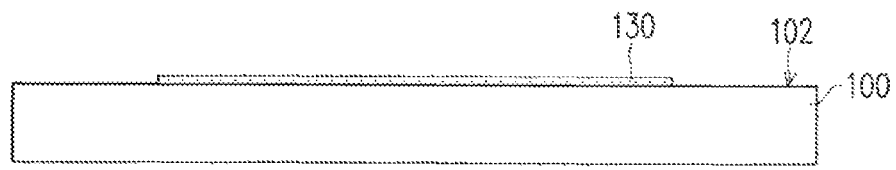
Figure 1C:
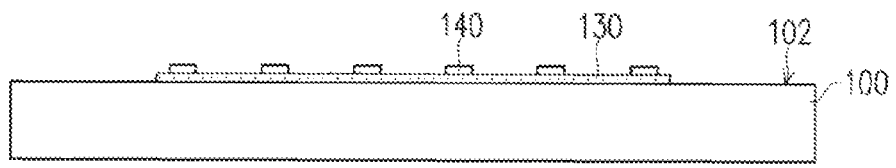
Figure 1D:
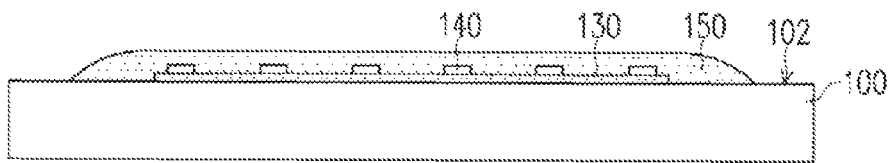
Figure 2:
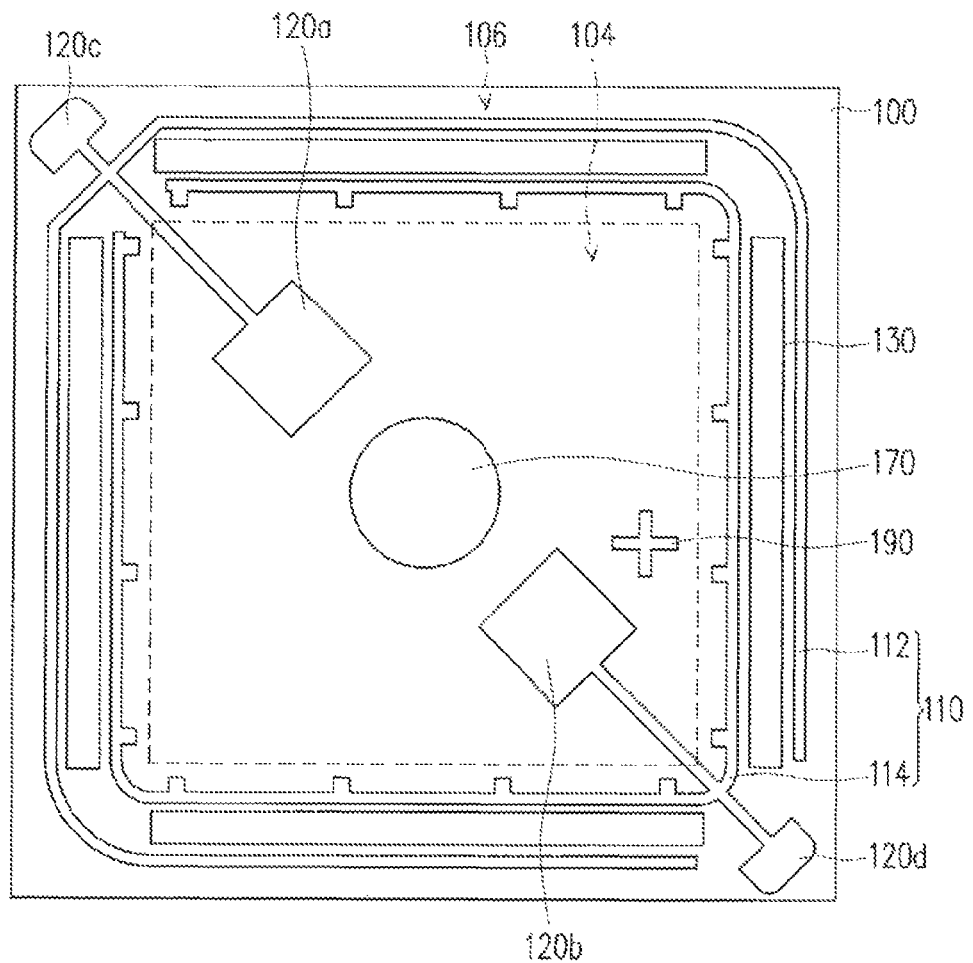
FIG. 2 is the top view of the light-transmissive substrate disclosed in FIG. 1B.

FIGS. 1A-1D show the process flow of the manufacturing method of an LED assembly, and FIG. 2 discloses the top view of a light-transmissive substrate. Referring to FIG. 1A and FIG. 2, the manufacturing method of an LED assembly 200 including steps described as follows. A light-transmissive substrate 100 is provided wherein the light-transmissive substrate 100 contains a surface 102, a central region 104, and a peripheral region 106 surrounding the central region 104. Before or after providing the light-transmissive substrate 100, a conductive structure 110 and four electrical contacts 120a, 120b, 120c, 120d separated from each other are optionally formed on the surface 102 of the light-transmissive substrate 100. Moreover, four electrical contacts 120a, 120b, 120c, 120d electrically connected with a conductive structure 112 or a conductive structure 114 are electrically isolated from each other. Furthermore, electrical contacts 120a, 120b are disposed inside the conductive structure 110, and electrical contacts 120c, 120d are disposed outside the conductive structures 110.

The light-transmissive substrate 100 is transparent or translucent, and the light emitted from LED is able to pass through the substrate. Material of the light-transmissive substrate 100 can be ceramic, glass, plastic, sapphire, and so on, depending on demands. Furthermore, ceramic includes but is not limited to alumina ($Al_2O_3$), yttrium alumina garnet, and neodymium-doped yttrium alumina garnet. Plastic includes but is not limited to polyimide, polyethylene terephthalate, PMMA, PC, epoxy, and silicone.

Referring to FIG. 1B and FIG. 2, a first wavelength conversion layer 130 is disposed on the surface 102 of the light-transmissive substrate 100 and is separated from the conductive structures 110 and the electrical contacts 120a, 120b, 120c, 120d. To be more specific, the first wavelength conversion layer 130 formed on the light-transmissive substrate 100 is located between the conductive structure 112 and the conductive structure 114 and is disposed in the peripheral region 106. The first wavelength conversion layer 130 of the present embodiment contains transparent glue and phosphor dispersed therein.

Figure 3:
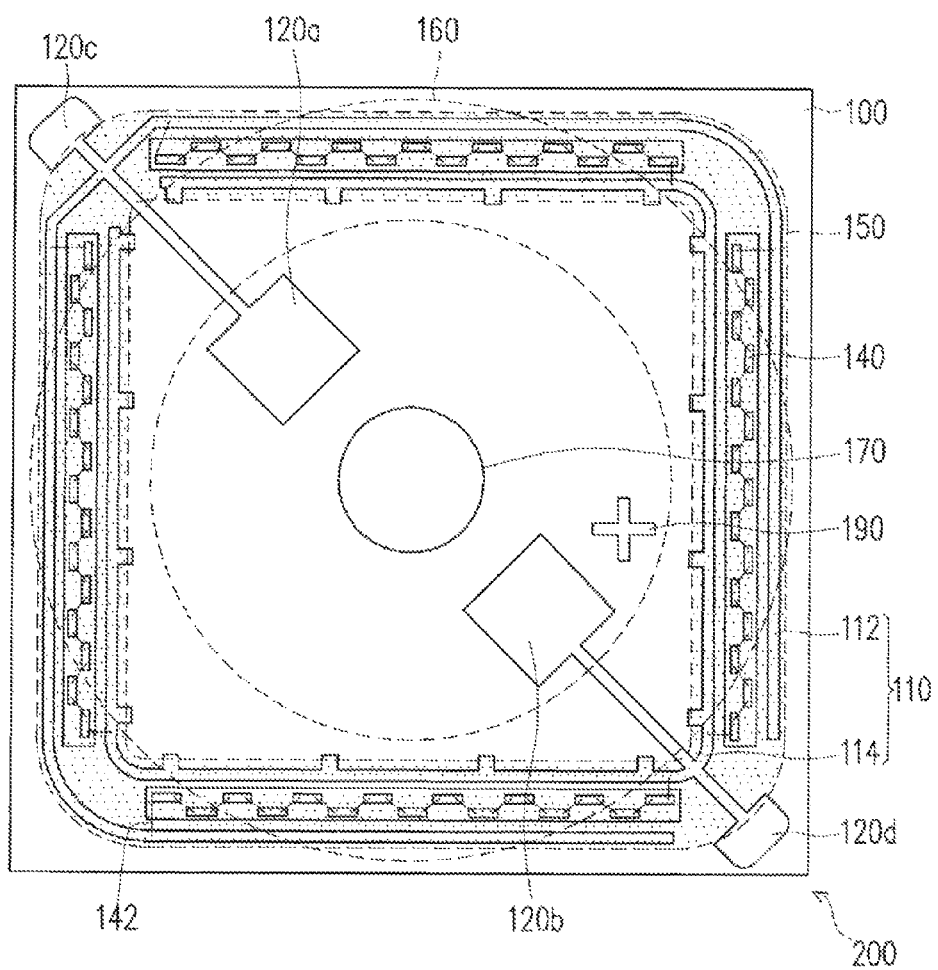
FIG. 3 is the top view of the LED assembly disclosed in first embodiment of the present application.

FIG. 3 is the schematic diagram of forming LED element on the light-transmissive substrate. Referring to FIG. 1C and FIG. 3, a plurality of LED elements 140 is formed on the first wavelength conversion layer 130 and makes the LED elements 140 electrically connect with the conductive structures 110, wherein the LED elements may be LED dies or packaged LED chips. In one embodiment, the plurality of LED elements 140 is mounted on the first wavelength conversion layer 130 and electrically connected each other by bonding wire 142.

Figure 1E:
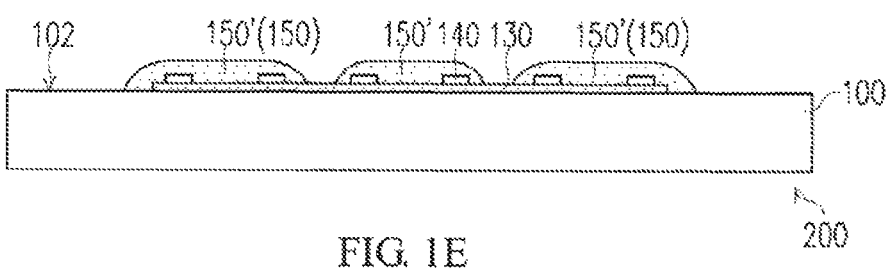
FIG. 1E is the schematic diagram of the second wavelength conversion of the LED assembly disclosed in another embodiment of the present application.

Referring to FIG. 1D and FIG. 3, a second wavelength conversion layer 150 is formed on the first wavelength conversion layer 130 so as to form an LED assembly. Therefore, the second wavelength conversion layer 150 covers the LED elements 140 and contains transparent glue and phosphor dispersed therein, wherein the second wavelength conversion layer 150 may be the same or different from the first wavelength conversion 130. In the present embodiment, the respective area of the first wavelength conversion layer 130 and the second wavelength conversion layer 150 is greater than the total area of the LED elements 140, so as to avoid the problem of light leakage caused by the light emitting out of the chip without mixing with light converted by the wavelength conversion layer. Furthermore, the areas of the first wavelength conversion layer 130 and the second wavelength conversion layer 150 projected on the light-transmissive substrate 100 may be the same or different, wherein the way the second wavelength conversion layer 150 covering the first wavelength conversion layer 130 may be continuous and full, partial, or the second wavelength conversion layer 150 having a plurality of portions 150' which respectively covers one or more LED elements 140. Furthermore, each of the portions may contain the same or different material of phosphor and be connected to or separated from each other as shown in FIG. 1E. The transparent glue of the first wavelength conversion layer 130 and the second wavelength conversion layer 150 may be resin or silicone gel and in which mixes with material of single color phosphor or multi-chromatic phosphor, such as yellow or green phosphor material respectively comprising the composition of Sr, Ga, S, P, Si, O, Gd, Ce, Lu, Ba, Ca, N, Si, Eu, Y, Cd, Zn, Se, Al, and so on. For example, material of the transparent glue may be epoxy, acrylic resin or silicone resin. Phosphor may be garnet phosphor, silicate phosphor or oxynitride phosphor. Phosphor also may be Yttrium Aluminum Garnet (YAG), Terbium Aluminum Garnet (TAG), Eu-activated alkaline earth silicate phosphor or SiAlON.

Referring to FIG. 3, the electrical contacts 120a, 120c are electrically connected to each other and further electrically connected to the conductive structure 112. The electrical contacts 120b, 120d are electrically connected to each other and further electrically connected to the conductive structure 114. For simple explanation, the electrical contacts 120a, 120b disposed inside the conductive structures 110 is respectively defined as a first electrical contact 120a and a second electrical contact 120b. In addition, the electrical contacts 120c, 120d disposed outside the conductive structures 110 is respectively defined as a third electrical contact 120c and a fourth electrical contact 120d. The LED assembly 200 may easily use the third electrical contact 120c and the fourth electrical contact 120d outside the conductive structures 110 for electrical test.

Figure 4:
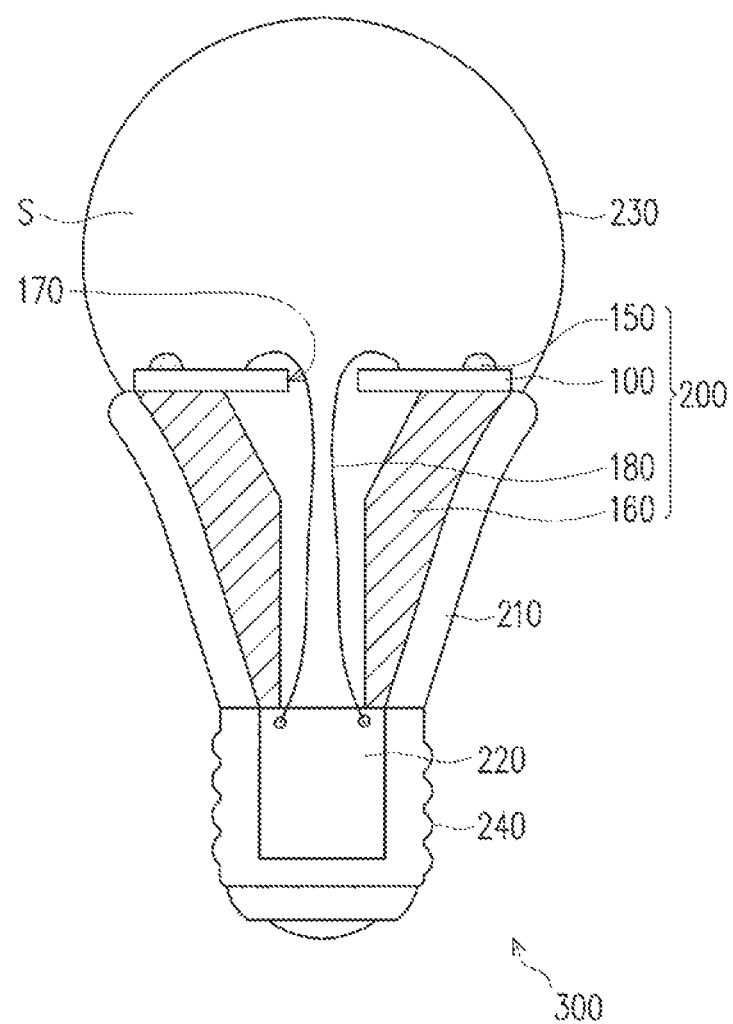
FIG. 4 is the schematic diagram of the LED bulb using the LED assembly disclosed in FIG. 3.

FIG. 4 is the schematic diagram of an LED bulb using the LED assembly disclosed in FIG. 3. Referring to FIG. 3 and FIG. 4, in the LED assembly 200 of the present embodiment, a heat dissipation element 160 contacts the light-transmissive substrate 100 and a part of the heat dissipation element 160 is disposed corresponding to the central region 104. By setting the heat dissipation element 160, the accumulated heat can be rapidly conducted and dissipated from the central region 104 of the light-transmissive substrate 100 so that the LED element 140 could keep good luminous efficiency and durability.

Figure 5:
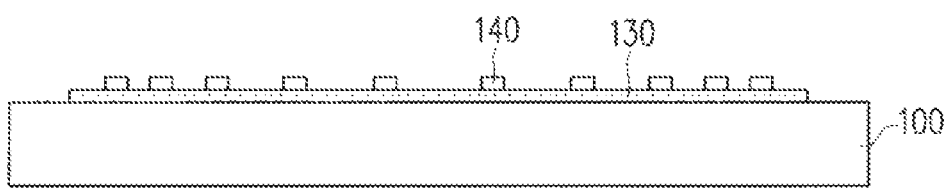
FIG. 5 is the schematic diagram of the arrangement of the LED elements disclosed in another embodiment of the present application.
Figure 6:
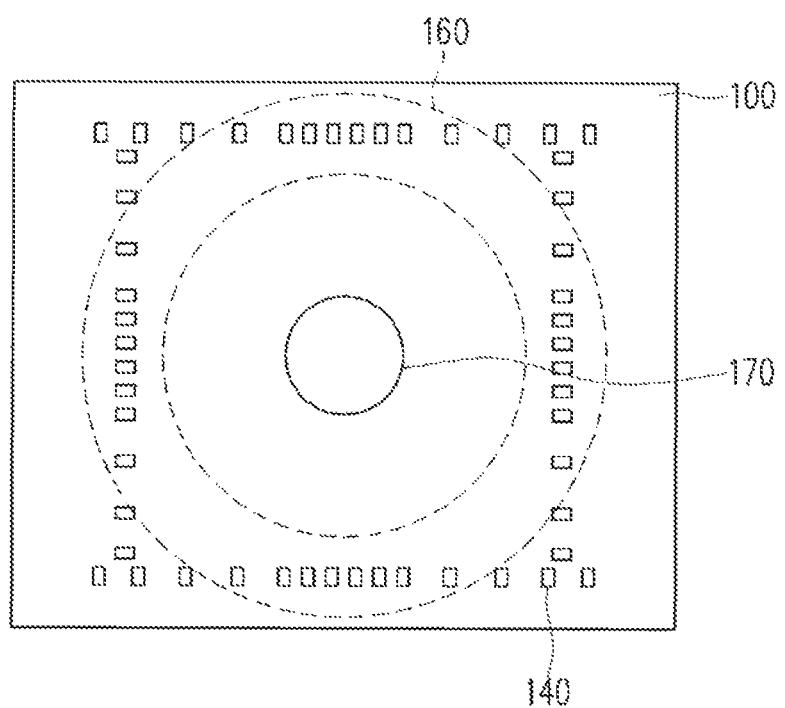
FIG. 6 is the schematic diagram of the arrangement of the LED elements which each has the heat dissipation element disposed below the light-transmissive substrate disclosed in another embodiment of the present application.

FIG. 5 shows the alignment of the LED elements, wherein the pitches of LED elements arranged toward the central region of the light-transmissive substrate are getting larger and those direct to the peripheral region are getting smaller. FIG. 6 is the schematic diagram of alignment of the LED elements when there is the heat dissipation element located below the light-transmissive substrate 100. Referring to FIG. 4, FIG. 5 and FIG. 6, generally the LED elements 140 are arranged with equal space, but the heat generated from the LED elements 140 is accumulated in the central region of the LED elements when arranged in rows or in columns so the heat cannot be dissipated easily, and thereby affects the efficiency and life time of the LED assembly. One of the solutions is to enlarge the pitches toward the central region of the light-transmissive substrate and to reduce the pitches toward the peripheral region. This arrangement of the LED elements 140 can efficiently distribute the heat of the LED elements 140 uniformly without concentrating in the central region 104 of the light-transmissive substrate 100, as shown in FIG. 2, so the efficiency of the LED assembly.

However, in the case of the heat dissipation element 160 installed below the light-transmissive substrate 100, as shown in FIG. 6, heat accumulated in the central region 104 of the light-transmissive substrate 100 can be rapidly conducted and dissipated by the heat dissipation element 160 so that the arrangement of the LED elements 140 is opposite to that shown in FIG. 5, which has a denser arrangement of the LED elements 140 closer to the heat dissipation element 160. In other words, when the optical performance of the LED assembly 200 (e.g., luminance or chrominance) is acceptable to a user or designer, the pitches of the LED elements 140 are narrower when the LED elements 140 are closer to the central region of the light-transmissive substrate 100. Though FIG. 6 illustrates a row of the LED elements 140, the row number or the arranged way of the LED elements 140 is not limited to this.

Referring to FIG. 4, in the present embodiment, the light-transmissive substrate 100 comprises a through hole 170, and the heat dissipation element 160 is a hollow column. When the LED assembly 200 is used in an LED bulb 300, the LED assembly 200 is disposed on a base 210. Moreover, the heat dissipation element 160 is a hollow column and is disposed within the base 210. A lampshade 230 covers the base 210 to define a housing space S. The LED assembly 200 is disposed within the lampshade 230 (housing space S). The LED assembly 200 is electrically connected to the light-transmissive substrate 100, the light-transmissive substrate 100 is electrically connected to a circuit board 220 in the base 210 via a pair of wires 180 passing though the through hole 170 of the light-transmissive substrate 100 and the hollow column of the heat dissipation element 160, and the circuit board 220 is further electrically connected to external power source by a lamp plug 240.

Figure 7:
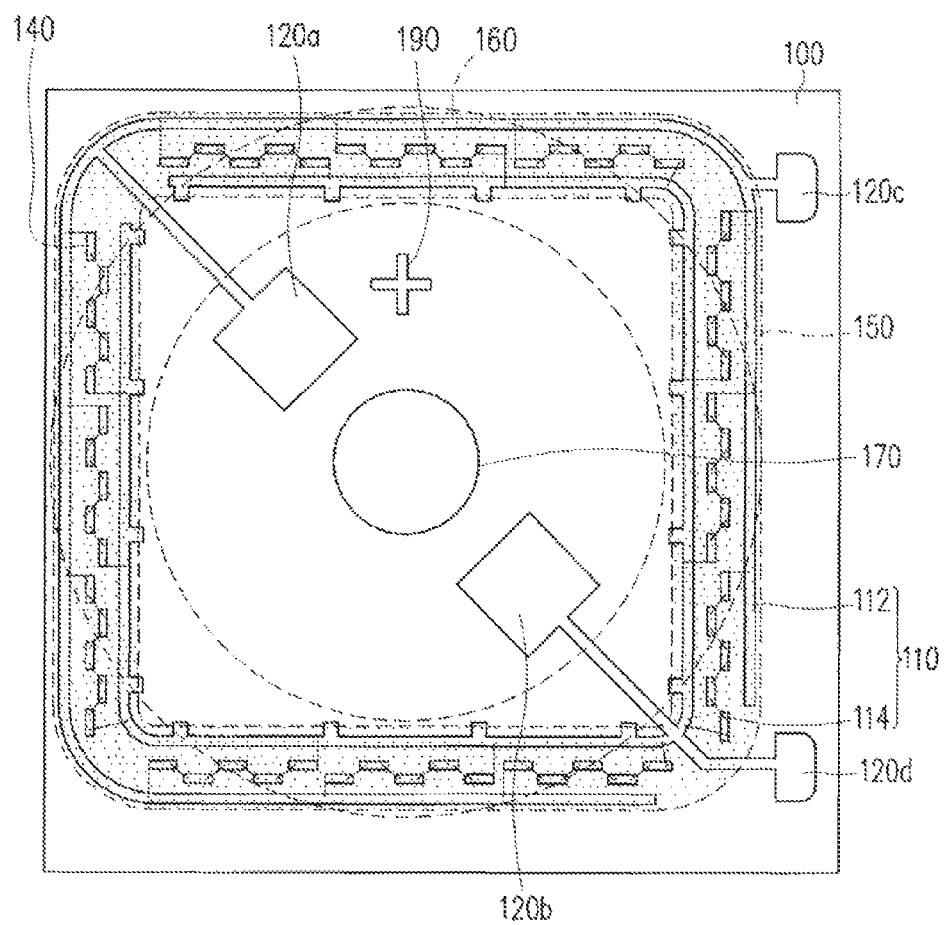
FIG. 7 is the schematic diagram of the circuit of the LED elements arranged in serial-parallel connection disclosed in another embodiment of the present application.

In consideration of the product appearance and the ease of use, with the through hole as the geometric center, the first electrical contact 120a and the second electrical contact 120b may be arranged symmetrically and the third electrical contact 120c and the fourth electrical contact 120d may be arranged symmetrically. As shown in FIG. 3, the first electrical contact 120a and the second electrical contact 120b are arranged symmetrically along a diagonal line of the light-transmissive substrate 100 with the through hole 170 as the geometric center, and the third electrical contact 120c and the fourth electrical contact 120d are also arranged symmetrically in the same way. Referring to FIG. 7, with the through hole as the geometric center, the first electrical contact 120a and the second electrical contact 120b may be arranged symmetrically along a diagonal line of the light-transmissive substrate 100, and the third electrical contact 120c and the fourth electrical contact 120d are disposed vertically symmetrically with the through hole 170 as the geometric center. The symmetric arrangement can be replaced based on the demand, and is not limited to what are disclosed in this embodiment.

Figure 8:
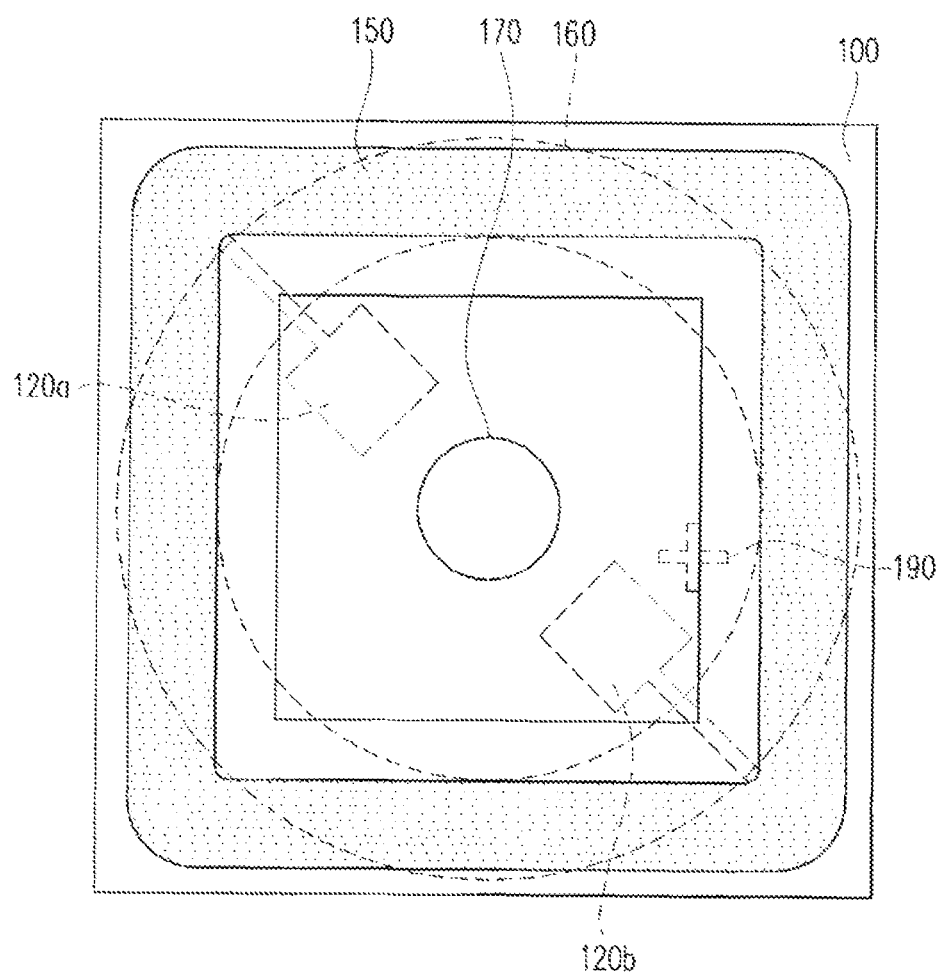
FIG. 8 is the schematic diagram of the second wavelength conversion layer having a shape of a closed loop in rectangular disclosed in one embodiment of the present application.
Figure 9:
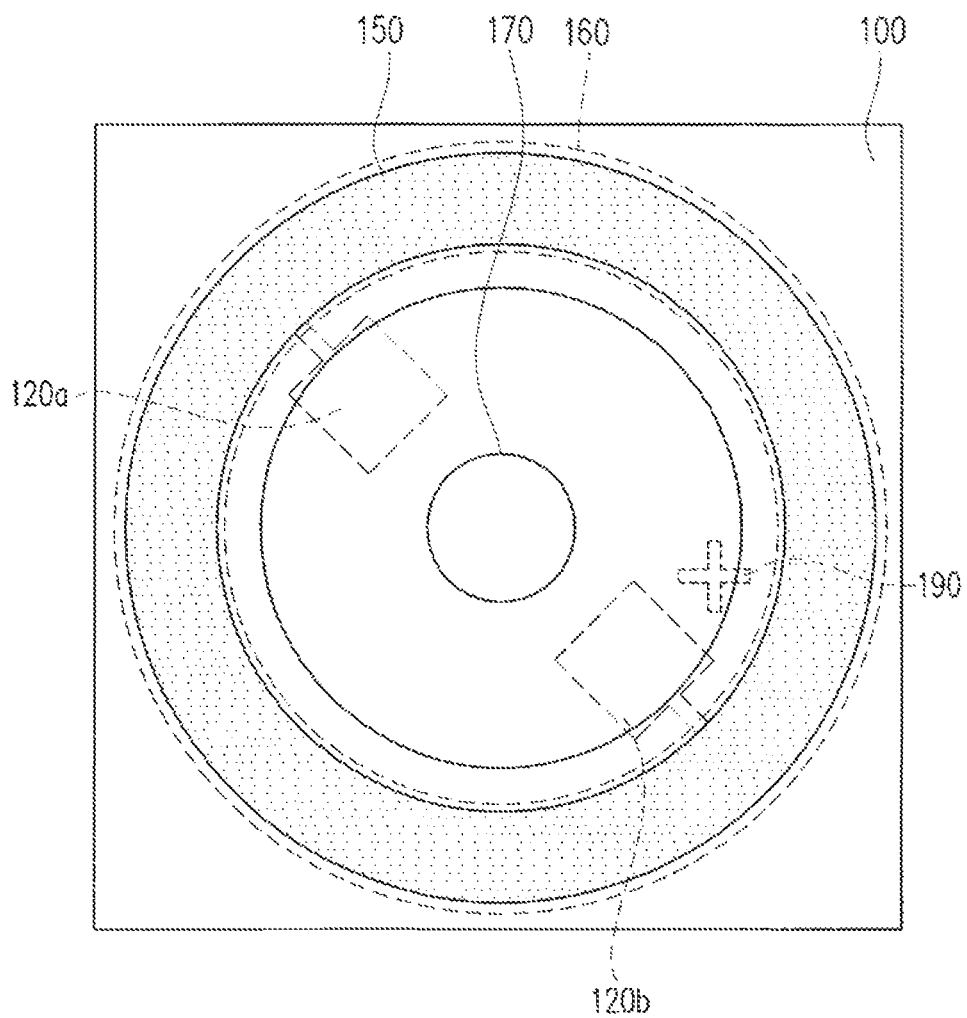
FIG. 9 is the schematic diagram of the second wavelength conversion layer having a shape of a closed loop in circle disclosed in one embodiment of the present application.

In the present embodiment, the LED elements 140 surround the through hole 170 and are generally arranged in a rectangular or circular. For example, the LED elements 140 may be arranged in four sides of the rectangle or the circumference of a circle. The LED elements 140 can also be arranged as a zig-zag to increase the number of the LED elements per unit length or unit area. The LED elements 140 can be arranged in single row or a plurality of rows. In one embodiment, every LED element 140 may include a single LED chip having a forward voltage of about 2~3 V, hereinafter referred to as low-voltage chips, or a chip comprising a plurality of the light-emitting cells connected in series and having a forward voltage greater than the low-voltage chip, such as 12V, 24V, 48V, and so on. To be more specific, unlike being connected by wire bonding, the high-voltage chips are formed of several LED units electrically connected to each other on a common substrate by the semiconductor process, wherein the LED unit is a light-emitting diode structure having only one light emitting junction. The common substrate may be growth substrate or non-growth substrate. Moreover, the circuitry of the LED elements 140 in the same raw can be a series like what is shown in FIG. 3, a parallel or serial-parallel connection as shown in FIG. 7, or a bridge structure based on the demand. Furthermore, in order to produce a certain light, each LED element 140 may emit different chromatic light to be mixed with each other as designed, or the emitted light of the LED elements 140 can be mixed with the light converted by the first wavelength conversion layer and the second wavelength conversion layer containing the phosphor. In accordance with the present embodiment, the LED element 140 is a blue LED, and the phosphor can be excited by a part of the blue light emitted from the blue LED 140, wherein the blue light has the wavelength peak of 430 nm~480 nm, to produce yellow light having a wavelength peak of 570 nm~590 nm, or yellow-green light. When yellow light or yellow-green light mixes with remaining blue light appropriately, the human eye can view as white light. The shape of the second wavelength conversion layer 150 covering the LED element 140 can be a closed loop similar to a rectangular shape as shown in FIG. 8 or a circular closed loop as shown in FIG. 9.

Furthermore, the top of the light-transmissive substrate 100 can have an aligned mark 190 in advance, wherein the aligned mark 190 can be used to align the light-transmissive substrate 100 to a correct position for forming the conductive structure 110, the electrical contacts 120a, 120b, 120c, 120d, or the LED elements 140 formed afterwards.

Second Embodiment

Figure 10:
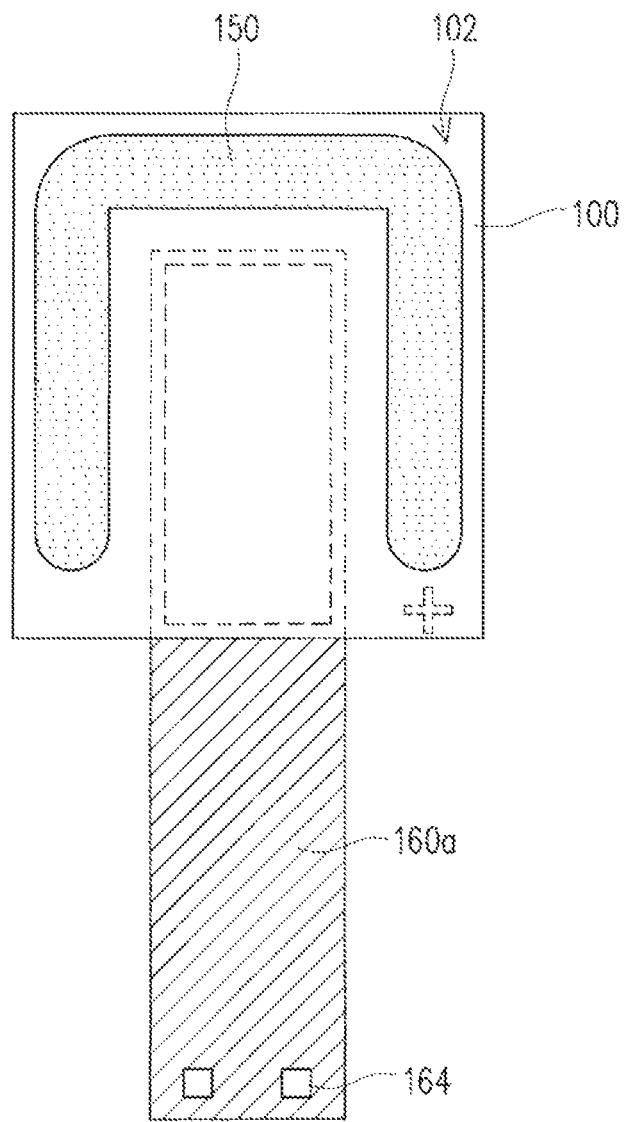
FIG. 10 is the top view of the LED assembly disclosed in the second embodiment of the present application.
Figure 11:
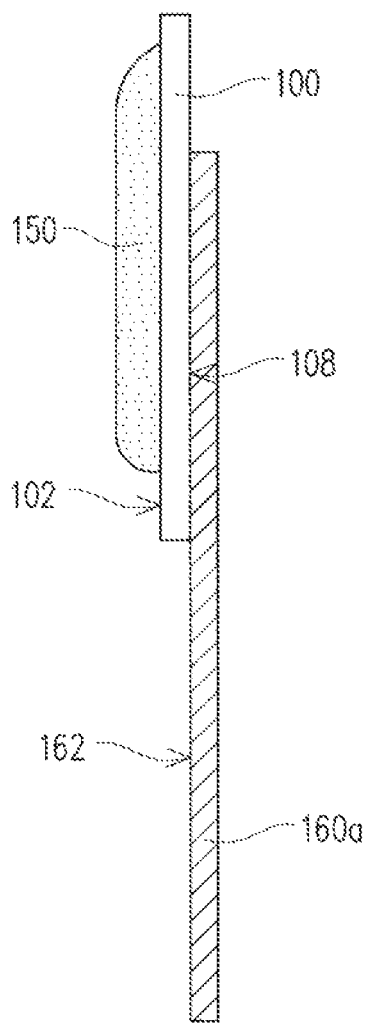
FIG. 11 is the side view of FIG. 10.
Figure 12:
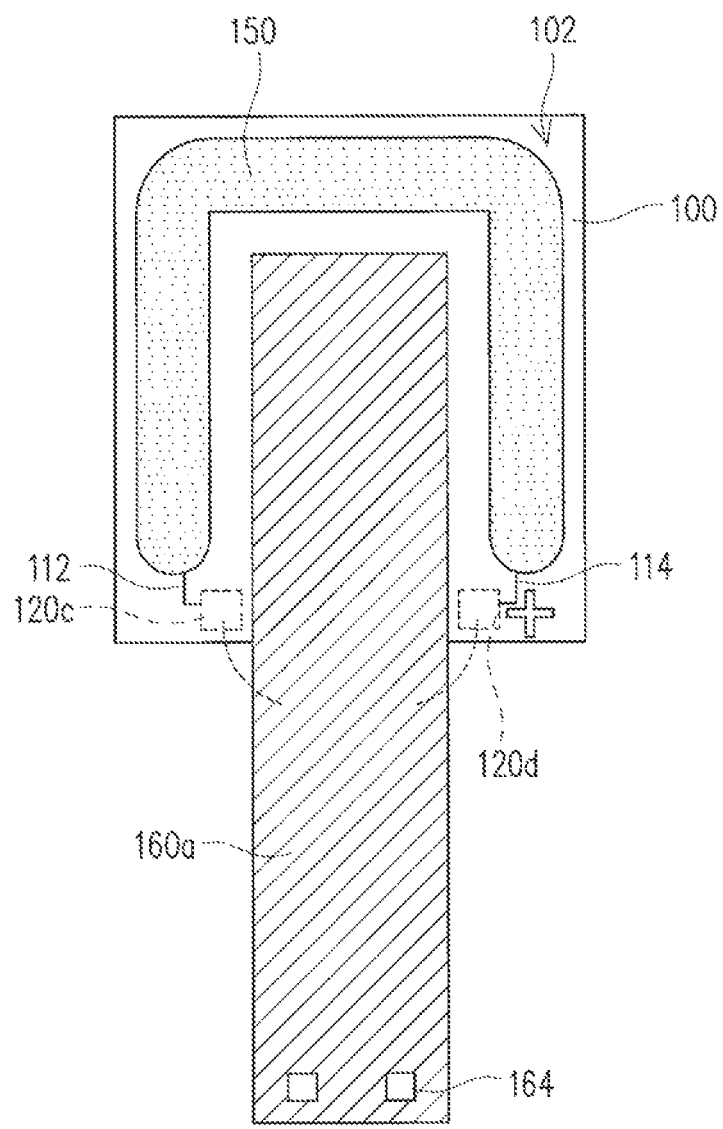
FIG. 12 is the top view of the LED assembly disclosed in another embodiment of the present application.
Figure 13:
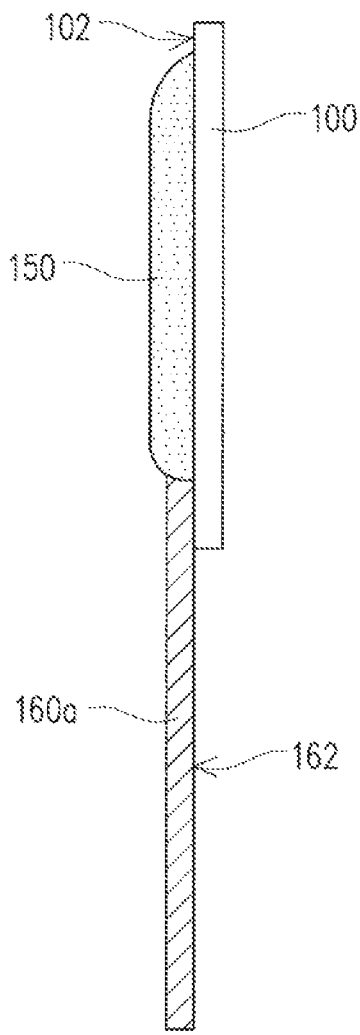
FIG. 13 is the side view of FIG. 12.
Figure 14:
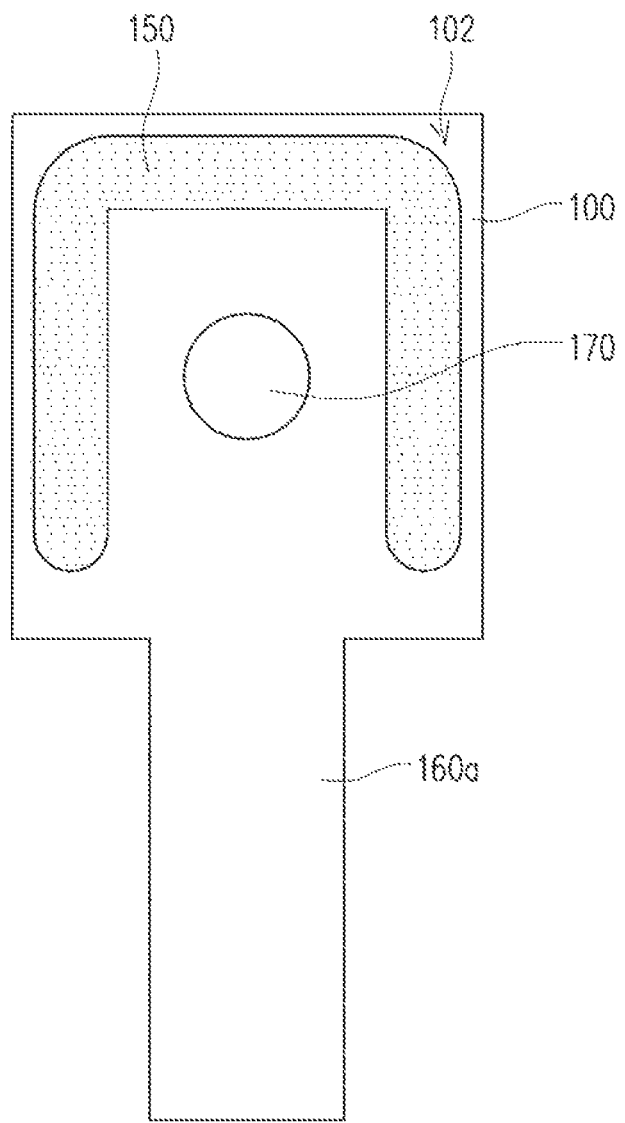
FIG. 14 is the LED assembly disclosed in another embodiment of the present application.

The present embodiment is substantially the same as the foregoing first embodiment, except that a heat dissipation element 160a of the present embodiment is a thermally conductive plate attached to the light-transmissive substrate. For example, a top surface of the thermally conductive plate 162 is attached to a surface 108 of the light-transmissive substrate 100 as shown in FIG. 10 and FIG. 11, or the top surface of the thermally conductive plate 162 is attached to a surface 102 of the light-transmissive substrate 100 as shown in FIG. 12 and FIG. 13. The thermally conductive plate may be metal plate of high thermal conductivity. The thermally conductive plate may also be Metal Core Printed Circuit Board (MCPCB) and the conductive structures 112, 114 are further electrically connected to the thermally conductive plate by wire bonding. The thermally conductive plate can be ceramic material and the thermal conductive plate and the light-transmissive substrate 100 are integrally molded as shown in FIG. 14. Moreover, as shown in FIG. 10 and FIG. 12, when the thermally conductive plate is a metal core printed circuit board or the ceramic material with a conductive structure disposed thereon, the thermal conductive plate has a pair of contacts 164 provided at the end relatively far away from the light-transmissive substrate 100, and the LED assembly can be inserted into the socket (not shown) on the circuit board 220 shown in FIG. 4 to form an electrical connection by socket and the contact 164.

In summary, the LED assembly of the present application and the LED bulbs using the LED assembly contain the light-transmissive substrate as the LED element carrier and are further assembled with the first wavelength conversion layer and the second wavelength conversion layer to emit light from the LED element passing the light-transmissive substrate and directing to the base (or the light-transmissive substrate) so the light emitting angle of the light from the LED element is increased so as to achieve an omnidirectional light pattern.

Furthermore, the design of the through hole with the thermally conductive element of the hollow column can provide the room for the wire passing through the heat dissipation element, not outside the heat dissipation element. Therefore, the wire is built in the heat dissipation element so that the fewer components are exposed and users feel neater and more beautiful.

Moreover, the arrangements of the heat dissipation element can dissipate heat of the LED elements quickly through the heat dissipation element so as to extend life time of the LED assembly and/or the LED bulbs using such LED assembly.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED assembly, comprising:
   a light-transmissive substrate comprising a surface, a central region and a peripheral region surrounding the central region;
   a heat dissipation element, wherein a portion of the heat dissipation element is corresponding to the central region of the light-transmissive substrate;
   a first wavelength conversion layer arranged on the surface of the light-transmissive substrate and corresponding to the peripheral region of the light-transmissive substrate;
   a plurality of LED elements arranged on the first wavelength conversion layer;
   a second wavelength conversion layer arranged on the surface of the light-transmissive substrate and covering the plurality of LED elements and the first wavelength conversion layer;
   a plurality of conductive structures surrounding the plurality of LED elements and electrically connected thereto, wherein the plurality of conductive structures is formed on the surface and separated from each other; and
   a plurality of electrical contacts electrically connected to the plurality of conductive structures respectively.

2. The LED assembly as claimed in claim 1, wherein the first wavelength conversion layer comprises a phosphor.

3. The LED assembly as claimed in claim 1, wherein the first wavelength conversion layer comprises a transparent glue and a phosphor dispersed therein.

4. The LED assembly as claimed in claim 2, wherein the phosphor comprises multi-chromatic phosphor.

5. The LED assembly as claimed in claim 1, wherein the light-transmissive substrate comprises a through hole.

6. The LED assembly as claimed in claim 5, wherein the through hole is disposed in the central region.

7. The LED assembly as claimed in claim 1, wherein the LED elements are arranged as four sides of the rectangle, a circular closed loop or zig-zag.

8. The LED assembly as claimed in claim 1, wherein the electrical contacts comprise a first electrical contact and a second electrical contact.

9. The LED assembly as claimed in claim 5, wherein the electrical contacts comprise a first electrical contact and a second electrical contact respectively arranged between the through hole and the plurality of LED elements.

10. The LED assembly as claimed in claim 9, further comprising a third electrical contact and a fourth electrical contact arranged outside the conductive structures.

11. The LED assembly as claimed in claim 9, wherein the first electrical contact and the second electrical contact are arranged symmetrically along a diagonal line of the light-transmissive substrate with the through hole as the geometric center.

12. The LED assembly as claimed in claim 1, wherein the heat dissipation element comprises a hollow column.

13. The LED assembly as claimed in claim 5, further comprising a pair of wires passing through the through hole.

14. The LED assembly as claimed in claim 13, wherein the heat dissipation element comprises a hollow column and the pair of wires pass through the hollow column.

15. The LED assembly as claimed in claim 1, wherein the heat dissipation element comprises a thermally conductive plate.

16. The LED assembly as claimed in claim 15, wherein the thermally conductive plate is attached to the light-transmissive substrate.

17. The LED assembly as claimed in claim 1, wherein the LED elements further comprise a plurality of pitches, and the pitches are narrower when the LED elements are closer to the heat dissipation element.

18. The LED assembly as claimed in claim 1, wherein the LED elements further comprise a plurality of pitches, and the pitches are narrower when the LED elements are closer to the peripheral region of the light-transmissive substrate.

19. The LED assembly as claimed in claim 1, further comprising an aligned mark disposed on the light-transmissive substrate.

20. An LED bulb, comprising:
   a base;
   a lampshade connected to the base and defined as a housing space; and
   the LED assembly as claimed in claim 1 disposed in the housing space and electrically connected to the base.

21. The LED assembly as claimed in claim 1, wherein a respective area of the first wavelength conversion layer and the second wavelength conversion layer is greater than a total area of the LED elements.

* * * * *